US012577674B2

(12) United States Patent
Hahn et al.

(10) Patent No.: US 12,577,674 B2
(45) Date of Patent: Mar. 17, 2026

(54) METHOD FOR IDENTIFYING SUBSTRATES WHICH ARE FAULTY OR HAVE BEEN INCORRECTLY INSERTED INTO A CVD REACTOR

(71) Applicant: AIXTRON SE, Herzogenrath (DE)

(72) Inventors: Utz Herwig Hahn, Raeren (BE);
Martin Dauelsberg, Aachen (DE);
Thomas Schmitt, Mönchengladbach (DE)

(73) Assignee: AIXTRON SE, Herzogenrath (DE)

( * ) Notice: Subject to any disclaimer, the term of this patent is extended or adjusted under 35 U.S.C. 154(b) by 47 days.

(21) Appl. No.: 18/018,528

(22) PCT Filed: Jul. 20, 2021

(86) PCT No.: PCT/EP2021/070262
§ 371 (c)(1),
(2) Date: Jan. 27, 2023

(87) PCT Pub. No.: WO2022/023122
PCT Pub. Date: Feb. 3, 2022

(65) Prior Publication Data
US 2023/0295807 A1     Sep. 21, 2023

(30) Foreign Application Priority Data
Jul. 28, 2020    (DE) ..................... 10 2020 119 873.6

(51) Int. Cl.
*C23C 16/52*        (2006.01)
*C23C 16/458*       (2006.01)
*C23C 16/46*        (2006.01)
(52) U.S. Cl.
CPC .......... *C23C 16/52* (2013.01); *C23C 16/4584* (2013.01); *C23C 16/46* (2013.01)

(58) Field of Classification Search
CPC ......... H01L 21/67259; H01L 21/67253; H01L 21/68771; H01L 21/67294; H01L 21/67288; C23C 16/52; C23C 16/4584
See application file for complete search history.

(56) References Cited

U.S. PATENT DOCUMENTS

2003/0218144 A1    11/2003  Lin et al.
2004/0143412 A1     7/2004  Donald
(Continued)

FOREIGN PATENT DOCUMENTS

DE          69828973 T2     4/2006
DE    10 2011 053498 A1    3/2013
(Continued)

OTHER PUBLICATIONS

International Search Report mailed Oct. 18, 2021, from the ISA/European Patent Office, for International Patent Application No. PCT/EP2021/070262 (filed Jul. 20, 2021), 10 pgs.
(Continued)

*Primary Examiner* — Tabassom Tadayyon Eslami
(74) *Attorney, Agent, or Firm* — Ascenda Law Group, PC

(57)                ABSTRACT
With the aid of one or more optical sensors, substrates which are faulty or have been incorrectly inserted in a CVD reactor are identified. The one or more optical sensors sense properties of the surfaces of the substrates, for example layer thickness or temperature, before or during a treatment process of the substrates within the CVD reactor housing. The measurement values provided by the sensors can be plotted in the form of a measurement curve, and patterns are obtained from the measurement curve, each pattern corresponding to one of the substrates. The patterns are compared with each other or with a mean calculated from the patterns.

7 Claims, 2 Drawing Sheets

(56) References Cited

U.S. PATENT DOCUMENTS

| | | | |
|---|---|---|---|
| 2010/0216261 | A1 | 8/2010 | Brenninger et al. |
| 2011/0206843 | A1 | 8/2011 | Gurary et al. |
| 2013/0245969 | A1* | 9/2013 | Singlevich ........ H01J 37/32917 |
| | | | 702/58 |
| 2014/0345523 | A1* | 11/2014 | Kikuchi .................. C23C 16/52 |
| | | | 118/712 |
| 2015/0376782 | A1 | 12/2015 | Griffin et al. |
| 2016/0125589 | A1 | 5/2016 | Tertitski et al. |
| 2019/0013224 | A1 | 1/2019 | Chiba et al. |
| 2019/0096773 | A1 | 3/2019 | Kim et al. |
| 2019/0172739 | A1 | 6/2019 | Nakamura et al. |
| 2019/0188840 | A1 | 6/2019 | Kwon et al. |

FOREIGN PATENT DOCUMENTS

| | | | |
|---|---|---|---|
| DE | 102011053498 | * | 3/2013 |
| DE | 10 2013 114412 A1 | | 6/2015 |
| DE | 10 2015 100640 A1 | | 7/2016 |
| DE | 10 2018 125531 A1 | | 4/2020 |
| EP | 2684979 A1 | | 1/2014 |
| JP | 2010258383 A | | 11/2010 |
| WO | 2008/023693 | * | 2/2008 |

OTHER PUBLICATIONS

Written Opinion mailed Oct. 18, 2021, from the ISA/European Patent Office, for International Patent Application No. PCT/EP2021/070262 (filed Jul. 20, 2021), 15 pgs.

International Preliminary Report on Patentability issued Jan. 31, 2023, from The International Bureau of WIPO, for International Patent Application No. PCT/EP2021/070262 (filed Jul. 20, 2021), 31 pgs.

Written Opinion mailed Oct. 18, 2021, from the ISA/European Patent Office, for International Patent Application No. PCT/EP2021/070262 (filed Jul. 20, 2021), English translation, 14 pgs.

* cited by examiner

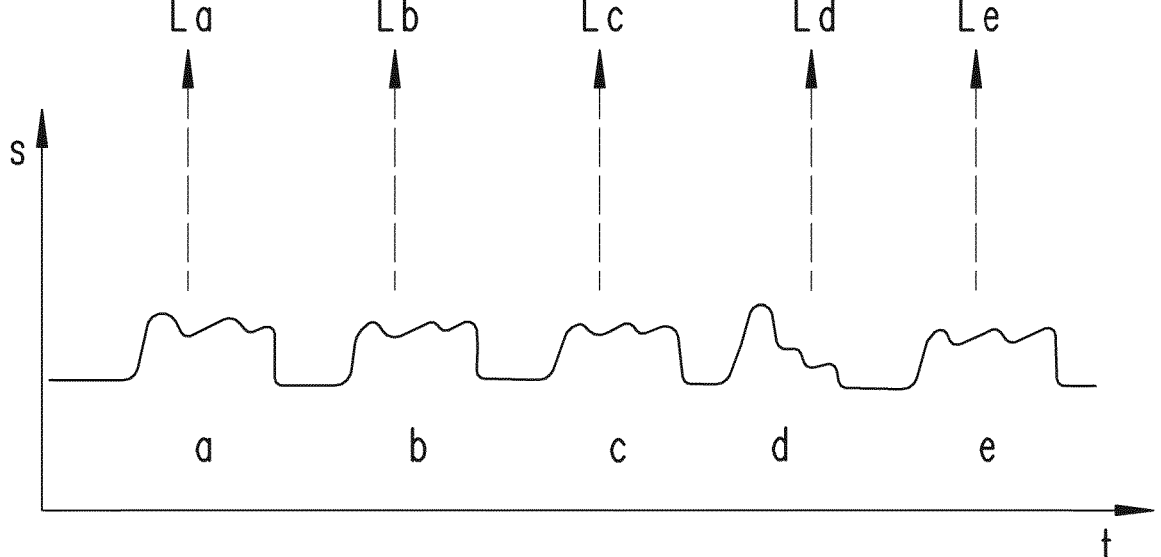
_Fig. 3_

METHOD FOR IDENTIFYING SUBSTRATES WHICH ARE FAULTY OR HAVE BEEN INCORRECTLY INSERTED INTO A CVD REACTOR

RELATED APPLICATIONS

This application is a National Stage under 35 USC 371 of and claims priority to International Application No. PCT/EP2021/070262, filed 20 Jul. 2021, which claims the priority benefit of DE Application No. 10 2020 119 873.6, filed 28 Jul. 2020.

FIELD OF THE INVENTION

The invention relates to a method for identifying faulty substrates, or substrates incorrectly inserted into a CVD reactor, with the aid of one or a plurality of optical sensors, which, before or during a treatment process of the substrates within a CVD reactor housing, acquire properties of the surfaces of the substrates, from which patterns are obtained, which in addition can be compared with reference patterns, and relates to a CVD reactor with a programmable computing device.

BACKGROUND

US 2016/0125589 A1 Now U.S. Pat. No. 9,959,610 describes a device and a method for determining a misalignment of a substrate in a CVD reactor, wherein optical measurement values are obtained at a plurality of different locations. The optical measurement values are compared with each other as a pattern.

US 2019/0172739 A1 Now U.S. Pat. No. 10,903,099 describes a method, with which a substrate rotating on a susceptor is optically observed in order to determine its position on the susceptor.

US 2015/0376782 A1 Now U.S. Pat. No. 10,196,741 describes a CVD reactor with a susceptor, in which substrates are arranged in a circle about an axis of rotation of the susceptor. In order to determine an inclination of the susceptor with respect to a plane of rotation, optical sensors are used to determine values of an interval during the rotation of the susceptor.

US 2010/0216261 A1 Now U.S. Pat. No. 8,357,549 describes a method for determining a lateral position of a substrate on a susceptor.

US 2019/0096773 A1 Now U.S. Pat. No. 10,541,182 describes a method for identifying a misalignment of a substrate on a susceptor in a CVD reactor, using optical sensors.

US 2019/0188840 A1 Now U.S. Pat. No. 10,713,778 describes a method by means of which faulty substrates, or substrates incorrectly arranged on a susceptor, can be identified.

DE 10 2013 114 412 A1, DE 10 2018 125 531 A1, DE 10 2015 100 640 A1, or DE 10 2015 100 640 A1, describe CVD reactors for the deposition of semiconductor layers on substrates. On a susceptor arranged in a reactor housing, a plurality of substrates are arranged in a regular manner, which are coated by feeding reactive gases into a process chamber. A heating device, with which the susceptor is heated, is regulated by means of signals from sensors. Some of these sensors measure the temperature of the surface of the substrates. The devices also have other optical sensors, with which the thickness of the deposited layer can be determined in situ during the deposition process. In particular this takes place by means of reflectance measurements.

The prior art furthermore includes US 2016/0125589 Now U.S. Pat. No. 9,959,610, EP 2 684 979 A1, JP 2010258383 A, US 2004/0143412 A1 Now U.S. Pat. No. 6,950,774, US 2003/0218144 A1 Now U.S. Pat. No. 6,737, 663 and DE 698 28 973 T2.

SUMMARY OF THE INVENTION

The invention is based on the object of identifying the generic method for the identification of faulty substrates, or substrates inserted incorrectly into a CVD reactor, and of executing the method with simple means.

The object is achieved by means of the features specified in the claims. The subsidiary claims represent not only advantageous developments of the technical solution specified in the main claim, but also independent solutions to the problem.

First and foremost, it is proposed that the reference patterns that are used to identify faulty, or incorrectly inserted substrates, by comparison with the patterns obtained during a deposition process, are obtained during the same deposition process. The reference pattern is obtained, and in particular calculated, from the same patterns with which the reference pattern is compared. The calculation of the reference pattern takes place during the treatment process.

The reference pattern can be continuously updated. The treatment process preferably takes the form of a coating process, in which layers, in particular single-crystalline layers, are deposited on a substrate by the feeding of reactive gases into a process chamber of the CVD reactor. The reactive gases can take the form of hydrides of the main group V and organometallic compounds of the main group III. However, reactive gases of the main groups II, IV or VI can also be used. The reactive gases decompose pyrolytically in the gas phase within the process chamber, or on the surface of the substrate, so that layers are deposited on the substrates. A susceptor, on which the substrates lie in a regular arrangement, for example in a circular arrangement about a center, is heated with a heating device. One or more sensors are provided, with which the temperature of the susceptor can be measured, in order to regulate the temperature of the susceptor with the measurement values delivered by the one or more sensors. Furthermore, sensors can be provided with which, if so required, only the surface temperatures of the substrates are measured. These sensors are preferably fixedly connected to the housing of the CVD reactor. The susceptor can be rotated about an axis of rotation. During this rotation, the substrates move underneath a measuring point of the sensors, so that the measuring point moves along an arc line over the susceptor, and the substrates arranged on the susceptor. During this measurement, measurement values are continuously recorded, with which, on the one hand, the temperature and/or the temperature distribution on the surface of the substrates can be determined, or, on the other hand, with which the thickness of the layers deposited on the substrates can be continuously measured. The sensors can take the form of one or more pyrometers. The pyrometers can be sensitive in the UV and/or IR range. The measurements can take the form of reflectance measurements. As the measuring point moves over the substrates during the measurement, the continuously recorded measurement values provide a measurement curve that has timewise successive structures that specify characteristic properties of the substrates. Hitherto, these structures have been used to determine the lateral temperature distribution, that is to say, the homogeneity of the growth. In accordance with the invention, these structures are used to identify faulty substrates, or substrates incorrectly inserted into the CVD reactor. For this purpose, patterns are formed from the measurement values. This can be done with the known methods of image recognition: Fourier transformation, noise analysis, or the like. To identify the faults, the patterns are compared with each other. In particular, provision is made for a reference pattern to be calculated from the measurement values recorded during a complete rotation of the susceptor and measurement values formed therefrom, which pattern is compared with all individual patterns recorded during the same rotation of the susceptor. The at least one sensor can be used to record a measurement curve during one or more rotations of the susceptor, which curve has structures arranged one after the other in time, wherein each structure is obtained during the movement of the measuring point over one of the substrates. Patterns can be calculated from these structures, each of which can be assigned to an individual substrate. These patterns can change during the treatment process, that is to say, in particular during the deposition of a layer on the substrates, in that they are updated with the current measurement values after each rotation of the susceptor, or after a number of rotations of the susceptor. Provision can be made for values that can be compared with each other to be formed from the patterns. These values can be scalars, vectors, or matrices. A characteristic value or a mean value can be formed from the values. The values can have the property that a deviation between the values can be computed. Provision can be made for the values of the individual patterns to be compared with the characteristic value, and for a substrate to be considered faulty, whose associated value has a deviation from the characteristic value that is above a threshold value. Provision can also be made for a second threshold value to be defined and for the deposition process to be aborted if the associated value of a pattern has a deviation from the characteristic value that is above this second threshold value. Provision can furthermore be made for the at least one threshold value to be determined by means of machine learning. Provision can also be made for the patterns or the values obtained therefrom not to be compared with a characteristic value, but instead for the patterns or the values obtained therefrom to be compared with each other. Provision can furthermore be made for the deposition process not to be aborted if a deviation exceeds a threshold value, but instead for only a warning to be issued. In an example embodiment of the invention, provision can be made for at least one sensor to be used to measure at least one technological variable, for example a layer thickness, or a temperature, on the substrates lying on the susceptor rotating under the at least one sensor, for the at least one sensor to provide measurement values, which can be plotted in the form of a measurement curve, wherein the measurement curve has structures that can be assigned to each of the substrates, wherein the structures have patterns that are comparable with each other, from which values that can be compared with each other are obtained, wherein for the determination of a faulty, or incorrectly arranged, substrate, only the comparable values obtained from the simultaneously recorded measurement values are compared with each other, or with a mean value formed from the simultaneously recorded measurement values. The method can be executed both during a treatment process in which a plurality of substrates are simultaneously thermally treated, and also before a treatment process, for example during a heating phase. Provision can be made for measurement values recorded during a number of complete rotations of the susceptor to be used. During the rotation of the susceptor about its axis of rotation, the measuring point moves over an azimuthal angle of 360 degrees during one revolution. During this revolution, measurement values are recorded for each of the substrates located at their assigned azimuthal angles. After each revolution, these measurement values can be updated, or mean values can be obtained for the measurement values of each substrate.

The invention further relates to a CVD reactor with a susceptor that can be heated by a heating device. On the susceptor are storage locations for substrates. Process gas can be fed into a process chamber of the CVD reactor through a gas inlet unit. Sensors are provided, with which optical properties of the substrates can be measured. Furthermore, an electronic computing device is assigned to the CVD reactor, which is programmed such that faulty substrates, or substrates incorrectly inserted into the CVD reactor, are identified. The method corresponds to the method previously described.

BRIEF DESCRIPTION OF THE DRAWINGS

In what follows, an example embodiment of the invention is explained with reference to the accompanying figures. Here:

FIG. 3 shows schematically the profile of a signal S that is recorded by a sensor 6 during one rotation of the susceptor 2, wherein here the susceptor has five support positions for substrates 3 arranged about an axis of rotation A. The horizontal axis, which is designated as t, represents either time or the azimuthal angle of the measuring point on the susceptor.

DETAILED DESCRIPTION

Figures 1, 2:
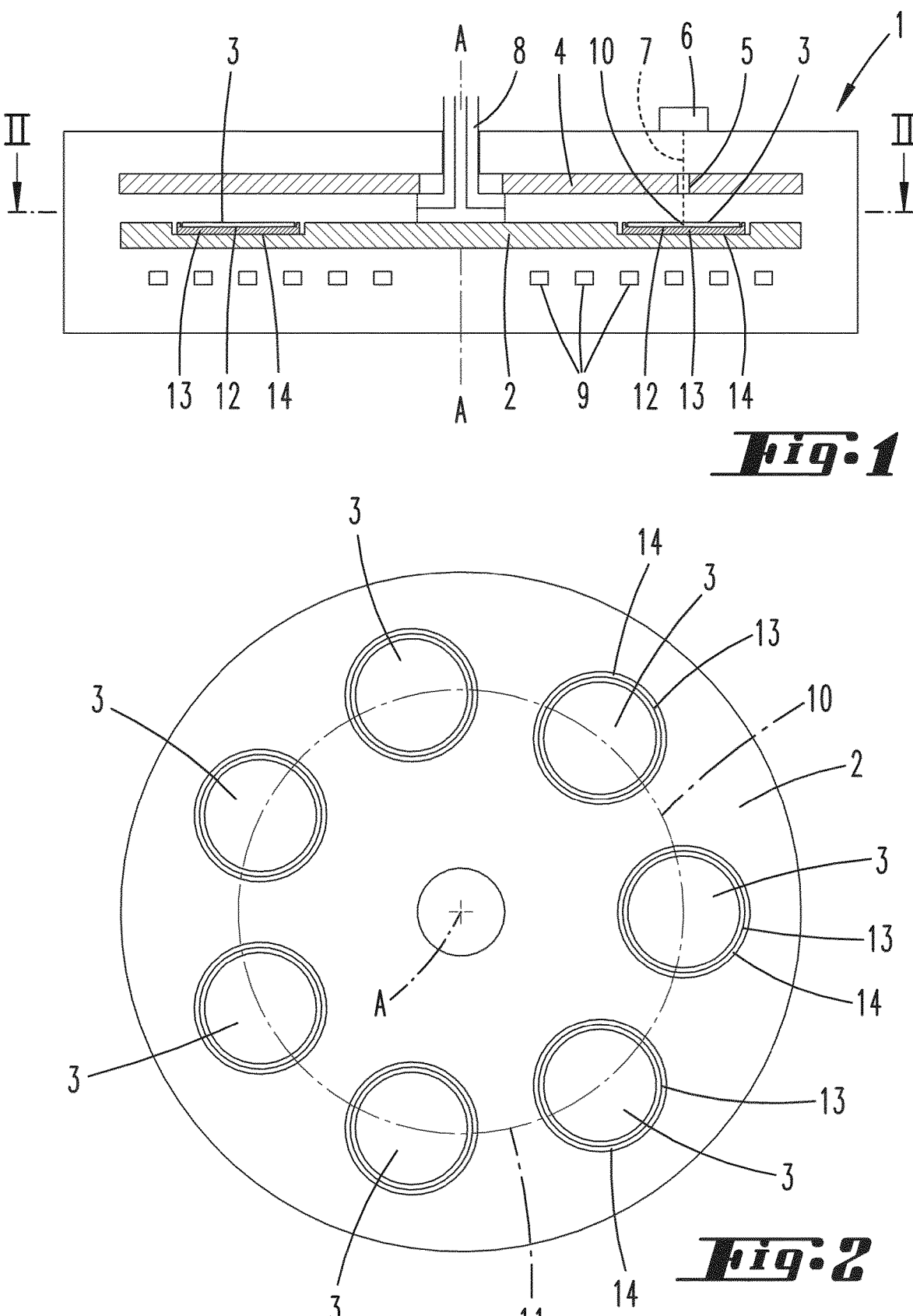
FIG. 1 shows schematically the cross-section of a CVD reactor for the execution of the method.
FIG. 2 shows the section along the line II-II (a plan view onto the susceptor 2), wherein the susceptor 2 has storage locations for one substrate 3 in each case.

FIG. 1 shows a CVD reactor with a reactor housing 1 that is gas-tight. Inside the reactor housing, between a process chamber ceiling 4 and a susceptor 2, is located a process chamber, into which reactive gases are fed through a gas inlet unit 8. The susceptor 2 is heated from below by means of a heating device 9. A plurality of substrates 3 lie on the susceptor 2. In the example embodiment, each of the substrates 3 lie in a pocket 12. The pocket 12 is formed by a substrate holder 13, which lies in a recess 14 of the susceptor 2. The substrate holder 13 can float on a gas cushion, which causes the substrate holder 13 to rotate about its axis. A beam path 7 of an optical sensor 6, which is fixedly connected to the housing 1, extends through a passage opening 5 within the process chamber ceiling 4. The beam path 7 impinges on a measuring point 10 on the substrate 3. The temperature of the substrate 3 can be measured with the sensor 6. However, it is also possible for the sensor 6, or another sensor, to be used to measure another optical property, for example the reflectance, of the substrate 3 in order to measure the layer thickness of the layers deposited on the substrates 3 continuously during the deposition process.

During the coating method, the susceptor 2 rotates about the axis of rotation A, so that the measuring point 10 moves on a circular path 11, over substrates 3 arranged in a circle, about the axis of rotation A. The circular path 11 can run through the center of the substrate 3, or the center of the pocket 12, or the center of the substrate holder 13.

In other example embodiments (not shown), the substrates 3 can be arranged in a dense hexagonal arrangement, or can be arranged in another manner, distributed over the entire surface of the susceptor 2. In these example embodiments, the gas inlet unit 8 can have the form of a showerhead. Suitable means are provided, by means of which a measuring point 10 of an optical sensor moves over the substrates 3; the beam path can, for example, be appropriately controlled by way of deflecting elements.

At least one of the one or more optical sensors 6 can be used to regulate the heating device 9, or other actuators of the CVD reactor.

During one rotation of the susceptor 2, the at least one sensor 6 supplies a signal that can have the approximate form shown in FIG. 3. In contrast to FIG. 2, this signal originates from a device in which five substrates 3 are arranged on the susceptor 2 in a uniform arrangement about the axis of rotation A. As the measuring point 10 moves over a substrate 3, a characteristic section of the measurement curve is formed, which has a certain pattern a, b, c, d, e. If all the substrates 3 have essentially the same quality, and are properly arranged on the susceptor 2, for example are correctly located in the pockets 12 that are formed in the top of the susceptor 2 to receive the substrates 3, the patterns a, b, c, d, e will be essentially the same or similar. In FIG. 3, these patterns take the form of a, b, c and e.

The section of the curve forming pattern d differs from the other patterns. By comparing patterns a, b, c, d, e with each other, the pattern d is considered to be different in accordance with the invention. The pattern d can thus correspond to a substrate 3 that is faulty, or is incorrectly inserted into the pocket 12.

To determine the faulty or incorrectly inserted substrate 3, values La, Lb, Lc, Ld, Le can be assigned to each of the patterns a, b, c, d, e. These values can be determined by means of a Fourier analysis, an image recognition, a noise analysis, or the like. Provision can be made for a mean value Lm to be formed from the values.

$$Lm=(La+Lb+Lc+Ld+Le)/5$$

All values can be compared with this mean value.

$$Aa=La-Lm$$

$$Ab=Lb-Lm$$

$$Ac=Lc-Lm$$

$$Ad=Ld-Lm$$

$$Ae=Le-Lm$$

If an interval Aa, Ab, Ac, Ad, Ae, between one of the values La, Lb, Lc, Ld, Le and the mean value Lm, exceeds a threshold value Ls, a warning can be issued that one of the substrates 3 is faulty, or incorrectly inserted. However, the exceedance of the threshold value can also cause a coating process to be aborted.

In accordance with the invention, not only sensor signals S obtained from a pyrometer that measures the temperature of the surface of the substrate can be used. It is also possible to use sensor signals S coming from other optical sensors, for example sensors that measure the thickness of the layers deposited on the substrates 3.

The threshold values can change dynamically. In particular, a machine learning method can be used for purposes of determining the threshold values. Provision can be made for the measurement values recorded by the sensors, for example spectra, to be stored in a database, and for the threshold values to be determined from such historical data.

The method in accordance with the invention can be used to determine whether substrates 3 are broken, or whether substrates 3 are not properly seated in their allocated pockets 12, or whether substrate holders 13, which are supported on gas cushions, and which carry one or more of substrates 3, are not rotating properly on the gas cushions.

FIG. 3 should also be understood in such a way that t indicates an azimuthal angle, and FIG. 3 shows the measurement curve for a complete rotation of the susceptor. From a plurality of such measurement curves, recorded one after the other, individualized and/or averaged patterns a, b, c, d, e can be determined for each substrate 3, or characteristic values La, Lb, Lc, Ld, Le can be formed from a plurality of patterns a, b, c, d, e determined one after the other, which in each case are calculated from a number of patterns individually assigned to a substrate.

The above statements serve to explain the inventions recorded by the application as a whole, which also independently advance the prior art, at least by means of the following combinations of features in each case, wherein it is possible for two, a plurality of, or all of these combinations of features also to be combined, namely:

A method, which is characterized in that the reference patterns are formed from the patterns a, b, c, d, e obtained during the same treatment process.

A method, which is characterized in that a plurality of substrates 3 of the same type are arranged in a regular arrangement on a susceptor 2.

A method, which is characterized in that the substrates 3 are arranged on at least one circular arc about an axis of rotation A of the susceptor 3, and in that the at least one optical sensor 6 is fixedly assigned to the reactor housing 1 in such a way that a measuring point 10 moves over the substrates 3 on a circular path 11 as a result of a relative rotation of the susceptor 2 with respect to the reactor housing 1.

A method, which is characterized in that the patterns a, b, c, d, e are obtained from the measurement values obtained during the movement of the measuring point 10 over the surface of the substrate 3, and in that an associated value La, Lb, Lc, Ld, Le is in each case formed from the patterns a, b, c, d, e obtained during at least one complete, or a plurality of complete, rotations of the susceptor 3, wherein the associated values can be compared with each other, and the values La, Lb, Lc, Ld, Le formed in this way are compared with each other in order to identify a fault.

A method, which is characterized in that the patterns a, b, c, d, e are obtained from reflectance values, or from measured temperature values.

A method, which is characterized in that the patterns a, b, c, d, e are calculated by processing the signals delivered by the at least one sensor 6, wherein, in the calculation, methods of image recognition, Fourier transformation, noise analysis, or the like, are used.

A method, which is characterized in that a characteristic value or mean value Lm is formed from the associated values La, Lb, Lc, Ld, Le, with which characteristic value or mean value all values La, Lb, Lc, Ld, Le are compared, and a fault is identified if an interval of one of the values La, Lb, Lc, Ld, Le from the characteristic value or mean value Lm lies above a threshold value Ls.

A method, which is characterized in that the patterns a, b, c, d, e are obtained from measurement values, which are obtained for purposes of controlling the CVD reactor, and/or for purposes of controlling a heating device 9 for the heating of the susceptor 2.

A method, which is characterized in that at least one technological variable, for example a layer thickness or a temperature, is measured with the at least one sensor 6 on the substrates 3 lying on the susceptor 2 and rotating under the at least one sensor 6, wherein the at least one sensor 6 delivers measurement values, which can be plotted in the form of a measurement curve, wherein the measurement curve has structures that can be assigned to each substrate 3 and that have patterns that can be compared with each other, wherein values La, Lb, Lc, Ld, Le that can be compared with each other are obtained from the patterns, which values are compared with a mean value formed from the simultaneously recorded measurement values.

A method, which is characterized in that a value La, Lb, Lc, Ld, Le associated with a substrate 3 is in each case formed from the plurality of patterns a, b, c, d, e individually associated with each substrate 3 by multiple movements of the measuring point 10 over the plurality of substrates 3, and the values La, Lb, Lc, Ld, Le are compared with each other.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterise with their features independent inventive developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognisably be dispensed with for the respective intended use, or can be replaced by other means having the same technical effect.

LIST OF REFERENCE SYMBOLS

1 Reactor housing
2 Susceptor
3 Substrate
4 Process chamber ceiling
5 Passage opening
6 Optical sensor
7 Beam path
8 Gas inlet unit
9 Heating device
10 Measuring point
11 Circular path
12 Pocket
13 Substrate holder
14 Recess
A Axis of rotation
S Sensor signal
a Pattern
b Pattern
c Pattern
d Pattern
e Pattern
t Time La Value
Lb Value
Lc Value
Ld Value
Le Value

What is claimed is:

1. A method for identifying, during a treatment process, faulty substrates (3), or substrates (3) with an incorrect placement within a process chamber of a chemical vapor deposition (CVD) reactor, the method comprising:
   translating a measuring point (10) over respective surfaces of a plurality of substrates (3) during the treatment process by rotating a susceptor (2) carrying the plurality of substrates (3) through at least one complete revolution of the susceptor (2);
   during the translation of the measuring point (10), obtaining by a single optical sensor (6) fixed to a reactor housing (1) a time-sequence of measurement values indicating optical properties of the respective surfaces of the substrates (3);
   computing, from the time-sequence of measurement values, a layer thickness of respective layers grown on the substrates (3);
   computing, from the time-sequence of measurement values, a measurement curve having portions individually corresponding to each of the substrates (3);
   determining, from the measurement curve, per-substrate patterns;
   determining a reference pattern from the per-substrate patterns; and
   identifying a fault by comparing each of the per-substrate patterns with the reference pattern.

2. The method of claim 1, wherein the substrates (3) are identical to one another and are arranged in a regular arrangement on the susceptor (2).

3. The method of claim 2, wherein the substrates (3) are arranged on at least one circular arc about an axis of rotation (A) of the susceptor (2).

4. The method of claim 1, wherein the fault is identified by comparing the associated values with each other.

5. A method for identifying, during a treatment process, faulty substrates (3) or substrates with an incorrect placement within a process chamber of a chemical vapor deposition (CVD) reactor, the method comprising:
   rotating a susceptor (2) about an axis of rotation (A) of the susceptor (2) through at least 360° about the axis of rotation (A), the susceptor (2) carrying a plurality of substrates (3);
   during the rotation of the susceptor (2) and during the treatment process, translating a measuring point (10) over respective surfaces of the plurality of substrates (3);
   during the translation of the measuring point (10), obtaining by a single optical sensor (6) fixed to a reactor housing (1) a time-sequence of measurement values indicating optical properties of the respective surfaces of the substrates (3);
   computing, from the time-sequence of measurement values, a layer thickness of respective layers grown on the substrates (3);
   determining, from the time-sequence of measurement values, per-substrate patterns;
   for each of the per-substrate patterns, determining an associated value; and
   identifying a fault by at least one of:
   comparing the associated values with one another; or comparing the associated values with a reference value determined from the associated values.

6. The method of claim 5, wherein the per-substrate patterns are determined by applying one or more of Fourier transformation or noise analysis to the time-sequence of measurement values.

7. The method of claim 5, wherein the reference value comprises a characteristic value or mean value determined from the associated values.

\* \* \* \* \*